United States Patent
Chen et al.

(10) Patent No.: US 10,121,933 B2
(45) Date of Patent: Nov. 6, 2018

(54) SEMICONDUCTOR DEVICE AND THE MANUFACTURING METHOD THEREOF

(71) Applicant: EPISTAR CORPORATION, Hsinchu (TW)

(72) Inventors: Meng Yang Chen, Hsinchu (TW); Rong Ren Lee, Hsinchu (TW); Shih Chang Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/468,688

(22) Filed: Mar. 24, 2017

(65) Prior Publication Data

US 2017/0279005 A1  Sep. 28, 2017

(30) Foreign Application Priority Data

Mar. 25, 2016  (TW) .............................. 105109463 A

(51) Int. Cl.
| | |
|---|---|
| *H01L 33/12* | (2010.01) |
| *H01L 33/00* | (2010.01) |
| *H01L 33/30* | (2010.01) |
| *H01L 33/22* | (2010.01) |

(52) U.S. Cl.
CPC ...... *H01L 33/0062* (2013.01); *H01L 33/0025* (2013.01); *H01L 33/12* (2013.01); *H01L 33/30* (2013.01); *H01L 33/22* (2013.01)

(58) Field of Classification Search
CPC . H01L 33/0062; H01L 33/0025; H01L 33/12; H01L 33/30; H01L 33/22
See application file for complete search history.

(56) References Cited

U.S. PATENT DOCUMENTS

| | | |
|---|---|---|
| 2005/0045870 A1 | 3/2005 | Chen et al. |
| 2008/0076235 A1 | 3/2008 | Hudait et al. |
| 2010/0032647 A1* | 2/2010 | Khan ................. H01L 21/0242 |
| | | 257/13 |

FOREIGN PATENT DOCUMENTS

TW  201125162 A  7/2011

* cited by examiner

*Primary Examiner* — Seahvosh Nikmanesh
(74) *Attorney, Agent, or Firm* — Ditthavong & Steiner, P. C.

(57) ABSTRACT

The present disclosure discloses a method forming a semiconductor light-emitting unit, comprising the steps of providing a semiconductor substrate; epitaxially growing a reaction layer on the semiconductor substrate; and epitaxially growing a buffer layer on the reaction layer; wherein the buffer layer and the semiconductor substrate are lattice-mismatched, and a dislocation density of the buffer layer is smaller than smaller than $1*10^9$ cm$^{-2}$.

19 Claims, 5 Drawing Sheets

SEMICONDUCTOR DEVICE AND THE MANUFACTURING METHOD THEREOF

TECHNICAL FIELD

This present application is related to a structure of light-emitting device and a producing method thereof.

RELATED APPLICATION DATA

This application claims the right of priority of TW Application No. 105109463, filed on Mar. 25, 2016, and the content of which is hereby incorporated by reference in its entirety.

DESCRIPTION OF BACKGROUND ART

III-V semiconductor has been popularly applied in the optoelectronic unit, such as LED and solar cell. III-V semiconductor compound is formed on a substrate by epitaxial growth technology, and the composition ratio of IIIA element to VA element can be adjusted to emit or absorb the light in specific wavelength range to match the function of the optoelectronic unit. As the composition ratio of IIIA element to VA element of the III-V semiconductor compound changes, the lattice constant of the III-V semiconductor compound may change. When the difference of lattice constant between the substrate and the epitaxial layer made of III-V semiconductor is too large, more dislocations are formed near the interface between the substrate and the epitaxial layer, and the light-emitting efficiency or the light-absorbing efficiency is decreased so the optoelectronic unit is degraded. Thus, in order to form the epitaxial stack with fewer dislocations, the substrate and the epitaxial stack are generally lattice-matched.

SUMMARY OF THE DISCLOSURE

The application discloses a method for forming a semiconductor unit. The method comprises providing a semiconductor substrate, epitaxially growing a reaction layer on the semiconductor substrate, and epitaxially growing a buffer layer on the reaction layer, wherein the crystal of the buffer layer and the crystal of the semiconductor substrate are lattice-mismatched, and the dislocation density of the buffer layer is smaller than $1*10^9$ cm$^{-2}$.

DETAILED DESCRIPTION OF PREFERRED EMBODIMENTS

Figure 1A:
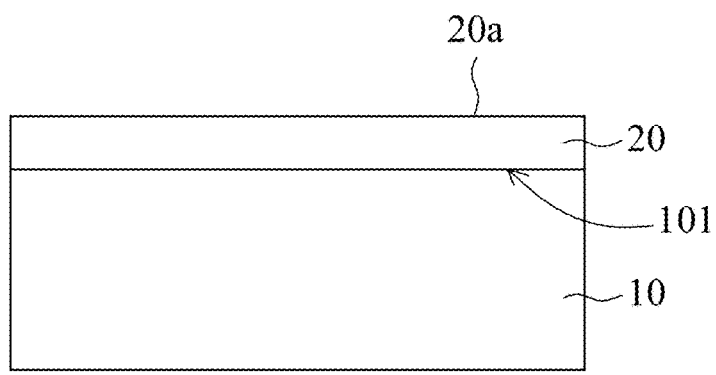
FIGS. 1A~1D show a process flow diagram of a method for forming the semiconductor light-emitting unit in accordance with the first embodiment.

The embodiments of the application are illustrated in details, and are plotted in the drawings. The same or the similar parts in the drawings and the specification have the same reference numeral. In the drawings, the shape and thickness of a specific element could be shrunk or enlarged. It should be noted that the element which is not shown in the drawings or described in the following description could be the structure well-known by the person having ordinary skill in the art. In this application, the binary semiconductor compound is the semiconductor compound made of 2 elements, such as InP; the ternary semiconductor compound is the semiconductor compound made of 3 elements, such as $In_yGa_{1-y}P$, $0<y<1$; quaternary semiconductor compound is the semiconductor compound made of 4 elements, such as $(Al_yGa_{1-y})_{1-x}In_xP$, $0<x<1$, $0<y<1$.

First Embodiment

FIGS. 1A~1D show a process flow diagram of a method for forming a semiconductor light-emitting unit 100 in accordance with the first embodiment. As shown in FIG. 1A, the method for forming the semiconductor light-emitting unit 100 comprises providing a growth substrate 10 and epitaxially growing a reaction layer 20 on the growth substrate 10 in an epitaxial growth equipment, wherein the epitaxial growth method comprises MOCVD (Metal-organic chemical vapor deposition), HVPE (Hydride vapor phase epitaxial) or LPE (Liquid-phase epitaxy). The reaction layer 20 and the growth substrate 10 are lattice-matched. A thickness of the growth substrate 10 is at least larger than 100 μm for supporting the structure or the stack formed later on thereof. The material of the growth substrate 10 comprises p-type or n-type III-V semiconductor compound, which is preferably a single crystal structure, wherein the III-V semiconductor compound comprises IIIA arsenide compound, such as n-type GaAs doped with n-type impurity comprising Si or Te. In the embodiment, the growth substrate 10 comprises IIIA arsenide, such as GaAs, and has a growth surface 101 for epitaxial growth, wherein the growth surface 101 and a crystal surface of (100) have an angle θ between thereof, 0 degree≤θ≤15 degrees. In the embodiment, the reaction layer 20 is epitaxially grown on the growth surface 101 of the growth substrate 10 and covers the entire growth surface 101. The reaction layer 20 has an upper surface 20a used for growing other epitaxial layer(s). The material of the reaction layer 20 comprises p-type or n-type III-V semiconductor material which comprises the elements different from the IIIA element or VA element of the growth substrate 10. In the embodiment, the reaction layer 20 comprises III-V quaternary semiconductor compound, such as $(Al_yGa_{1-y})_{1-x}In_xP$, $0<x<1$, $0<y<1$; in preferable embodiment, the material of the reaction layer 20 comprises $(Al_yGa_{1-y})_{1-x}In_xP$, $0.4\leq x\leq 0.6$, $0<y\leq 0.6$, wherein the reaction layer 20 is n-type semiconductor doped with Si, and the doping concentration of Si is between $1*10^{17}$ cm$^{-3}$ and $1*10^{19}$ cm$^{-3}$. In the embodiment, because the reaction layer 20 comprises Al, a protective layer (not shown) is formed to cover all of the upper surface 20a of the reaction layer 20 to prevent Al from being exposed in the air and oxidized in the following processes. The protective layer comprises the III-V semiconductor compound without Al, such as GaAs. Alternatively, the material of the reaction layer 20 comprises a ternary III-V semiconductor compound, such as $In_xGa_{1-x}P$, $0<x<1$. Because the reaction layer 20 does not have Al, a protective layer is not necessary formed to cover the upper surface 20a of the reaction layer 20. The thickness of the reaction layer 20 is between 0.1 μm~10 μm.

Figure 1B:
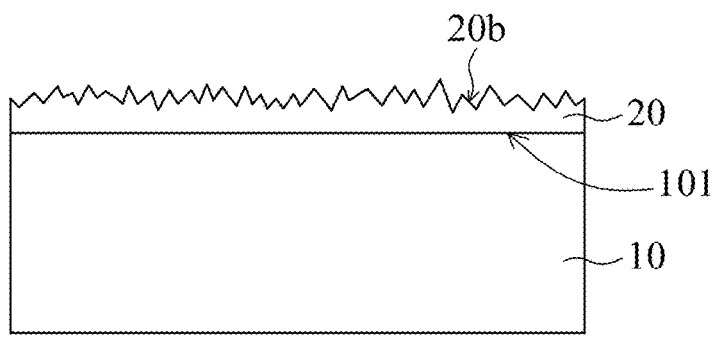

Next, as shown in FIG. 1B, after the structure shown in FIG. 1A is formed and moved out from the epitaxial growth equipment, the upper surface 20a of the reaction layer 20 is roughened to form an irregularly rough surface 20b. As the upper surface 20a is covered by the protective layer, the protective layer is totally removed and the upper surface 20a is roughened to form the irregularly rough surface 20b during the roughening process. The roughening process comprises wet etch process or dry etch process, wherein the etchant used in the wet etch process comprises phosphoric acid, ammonia or the combination thereof, and the dry etch process comprises plasma etching, such as RIE (Reactive Ion Etching) comprising ICP (Inductively Coupled Plasma).

Figure 1C:
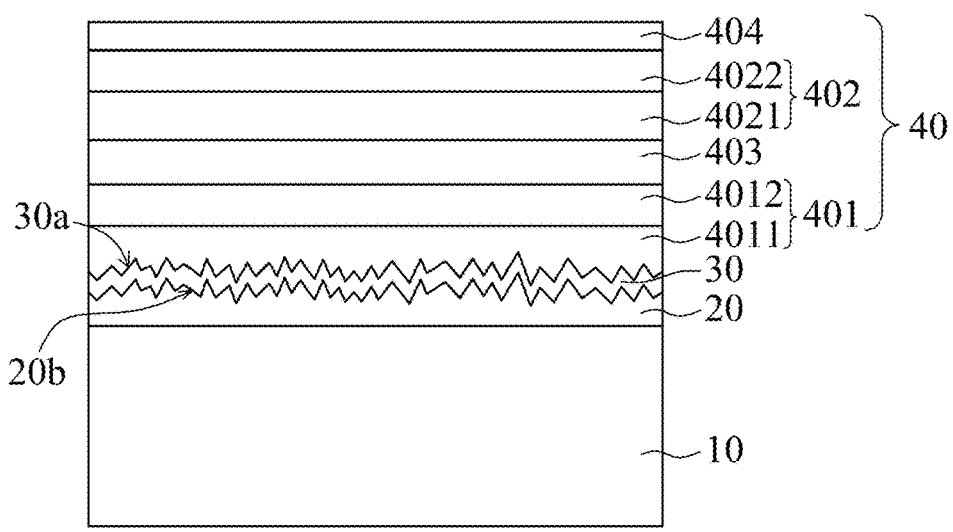

Then, as shown in FIG. 1C, the structure shown in FIG. 1B is put into the epitaxial growth equipment, and a buffer layer 30 is formed to cover all of the irregularly rough surface 20b by epitaxial growth method, wherein the epitaxial growth method comprises MOCVD (Metal-organic chemical vapor deposition), HVPE (Hydride vapor phase epitaxial) or LPE (Liquid-phase epitaxy). The buffer layer 30 and the reaction layer 20 are lattice-mismatched, and the buffer layer 30 and the growth substrate 10 are lattice-mismatched as well. In the embodiment, the material of the buffer layer 30 comprises IIA phosphide semiconductor and the bandgap thereof is smaller than 1.4 eV, such as $In_yGa_{1-y}P$, $0 \leq y \leq 1$. In the embodiment, the buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å, and the difference of the lattice constant between the buffer layer 30 and the growth substrate 10 is at least larger than 0.1 Å. The process of forming the buffer layer 30 comprises multiple annealing procedures, wherein the annealing procedure is performed in the epitaxial growth equipment by raising the temperature to a high temperature region and sustaining for minutes, lowering the temperature in the epitaxial growth equipment to a low temperature region and sustaining for minutes, and then immediately raising the temperature to the high temperature region and sustaining for minutes. The high temperature region is between 750° C. and 900° C., and the low temperature region is between 400° C. and 550° C. The annealing procedure is repeated for several cycles to release the stress due to the lattice mismatch between the buffer layer 30 and the reaction layer 20 and decrease the density of the dislocations in the buffer layer 30.

Next, a light-emitting stack 40 is formed on the buffer layer 30 by epitaxial growth method. The light-emitting stack 40 comprises a first semiconductor stack 401, an active stack 403, a second semiconductor stack 402 and a contact layer 404 sequentially epitaxially grown on a surface 30a of the buffer layer 30, wherein the epitaxial growth method comprises MOCVD (Metal-organic chemical vapor deposition), HVPE (Hydride vapor phase epitaxial) or LPE (Liquid-phase epitaxy). In the embodiment, the active stack 403 comprises MQW (Multi-Quantum Wells) structure which has multiple well layers and multiple barrier layers (not shown) alternately stacked. The first semiconductor stack 401 comprises an n-type cladding layer 4011 and an n-type confining layer 4012, and the second semiconductor stack 402 comprises a p-type cladding layer 4022 and a p-type confining layer 4021. The n-type cladding layer 4011 and the p-type cladding layer 4022 provide electrons and holes respectively. The n-type confining layer 4012 and the p-type confining layer 4021 can increase the percentage of the combination of the electrons and the holes in the active stack 403. The n-type confining layer 4012 and the p-type confining layer 4021 have bandgaps larger than or equal to the bandgap of the barrier layer of the active stack 403, or are thicker than the barrier layer of the active stack 403. The contact layer 404 comprises semiconductor material, of which the electrical polarity is the same as that of the second semiconductor layer 402, such as p-type. The concentration of the doping material of the contact layer 404 is between $10^{19}$ cm$^{-3}$ and $10^{21}$ cm$^{-3}$, which is higher than that of the second semiconductor stack 402, so that the contact layer 404 is able to ohmically contact an first electrode 50 which is formed subsequently, wherein the resistance between the contact layer 404 and the first electrode 50 is lower than $10^{-3}$ $\Omega/cm^2$.

Figure 1D:
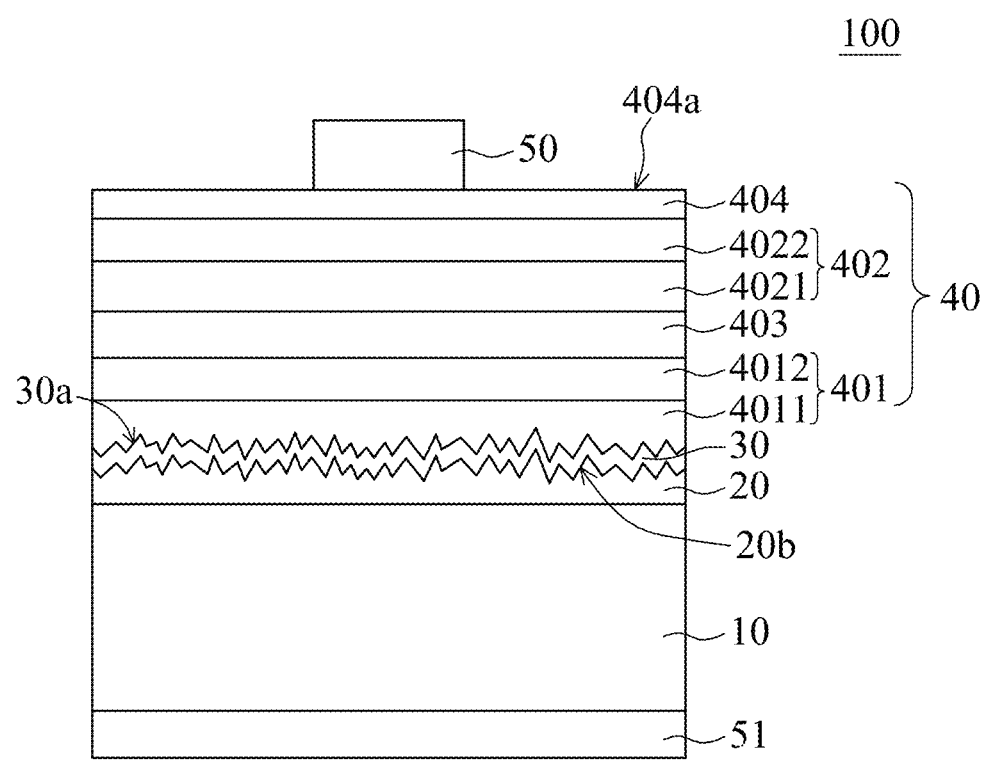

Next, as shown in FIG. 1D, the first electrode 50 is formed on an upper surface 404a of the contact layer 404, and a second electrode 51 is formed on the other side of the growth substrate 10 opposite to the reaction layer 20 to form a semiconductor light-emitting unit 100 in accordance with the first embodiment. In another embodiment, with the transfer process, the growth substrate 10 is replaced by a bonding substrate with higher electrical conductivity, higher heat conductivity, or larger transparency than the growth substrate 10 for different use. During the transfer process, the growth substrate 10 is removed and the bonding substrate is bonded to one side of the reaction layer 20 or the buffer layer 30 with a bonding structure to form a semiconductor light-emitting unit with the bonding structure.

As shown in FIG. 1D, the semiconductor light-emitting unit 100 comprises a growth substrate 10, a reaction layer 20 having a rough surface 20b, wherein the rough surface 20b is on a side opposite to the growth substrate 10, a buffer layer 30 on and covering all of the rough surface 20b, a light-emitting stack 40 on a surface 30a of the buffer layer 30, a first electrode 50 on an upper surface 404a of the contact layer 404, and a second electrode 51 on the other side of the growth substrate 10 opposite to the reaction layer 20.

A thickness of the growth substrate 10 is at least larger than 100 μm. The material of the growth substrate 10 comprises p-type or n-type III-V semiconductor compound, which is preferably a single crystal structure, wherein the III-V semiconductor compound comprises GaAs, such as n-type GaAs doped with n-type impurity comprising Si or Te.

The average roughness (Ra) of the rough surface 20b is between 1 nm and 100 nm. The thickness of the reaction layer 20 is between 0.1 μm~10 μm.

Figure 4:
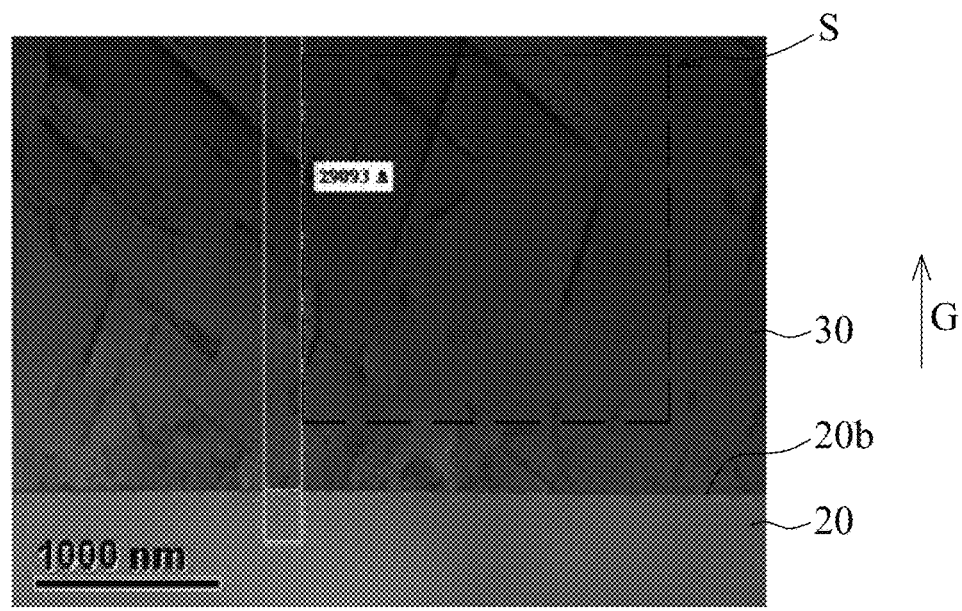
FIG. 4 shows a cross-sectional TEM (Transmission Electron Microscopy) image of the buffer layer disclosed in the first embodiment.
Figure 5:
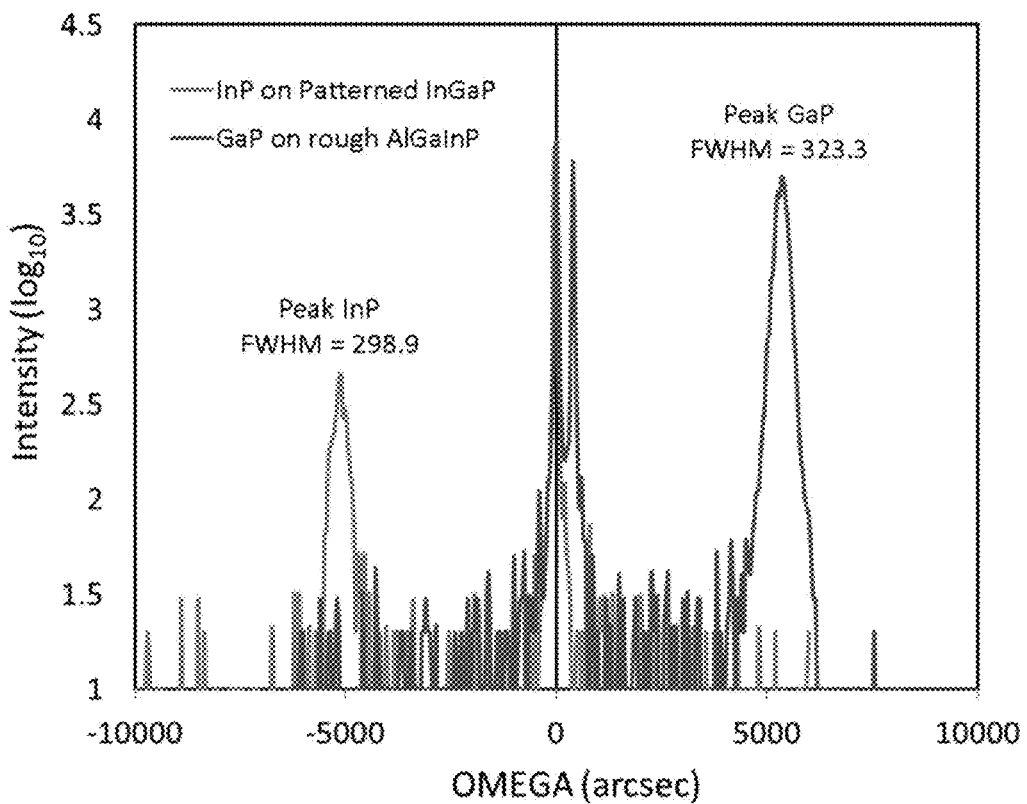
FIG. 5 shows an XRD (X-ray diffraction) chart of the buffer layer disclosed in the first embodiment.

In the embodiment, the buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å, and the difference of the lattice constant between the buffer layer 30 and the growth substrate 10 is at least larger than 0.1 Å. FIG. 4 shows a cross-sectional TEM (Transmission Electron Microscopy) image of the buffer layer 30. In the embodiment, the buffer layer 30 has a dislocation density smaller than $1*10^9$ cm$^{-2}$, and preferably between $1*10^7$ cm$^{-2}$, wherein the method of calculating the dislocation density is to calculate the dislocation density of the buffer layer 30 along the epitaxial growth direction G on the cross-sectional TEM image. The method for calculating the dislocation density comprises the steps of defining a region S on the image as shown in FIG. 4, counting the dislocation in the region S for getting a number of the dislocation in the region S, and dividing the number of the dislocation by the area of the region S. In the example, the area of the region S is a square of $2*2$ μm$^2$ As shown in FIG. 5, the quality of the buffer layer 30 is evaluated by XRD (X-ray diffraction)

chart, and the XRD chart of the buffer layer 30 has a FWHM (Full Width at Half Maximum) smaller than 500 arcsec.

The peak wavelength of the light emitted from the light-emitting stack 40 is determined by the material of the well layers of the active stack 403. In the embodiment, the difference of the lattice constant between the first semiconductor stack 401 and the buffer layer 30 is smaller than 0.1 Å, and the difference of the lattice constant between the first semiconductor stack 401 and the reaction layer 20 is at least larger than 0.1 Å. The first semiconductor stack 401 comprises InP or $In_bAl_{1-b}As$, 0<b<1, and is doped with Si or Te, wherein the doping concentration of Si or Te is between $5*10^{16}$ cm$^{-3}$ and $5*10^{18}$ cm$^{-3}$. The thickness of the first semiconductor stack 401 is between 0.1 μm and 10 μm, and preferably between 0.1 μm and 2 μm. The difference of the lattice constant between the second semiconductor stack 402 and the buffer layer 30 is smaller than 0.1 Å, the difference of the lattice constant between the second semiconductor stack 402 and the reaction layer 20 is at least larger than 0.1 Å, and the difference of the lattice constant between the second semiconductor stack 402 and the growth substrate 10 is at least larger than 0.1 Å. The second semiconductor stack 402 comprises InP or $In_bAl_{1-b}As$, 0<b<1, and is doped with Zn, C, or Mg, wherein the doping concentration of Zn, C, or Mg is between $5*10^{16}$ cm$^{-3}$ and $5*10^{19}$ cm$^{-3}$. The thickness of the second semiconductor stack 402 is between 0.1 μm and 10 μm, and preferably between 0.1 μm and 2 μm. The contact layer 404 comprises $In_xGa_{1-x}As$, 0<x<1, and is doped with Zn, C, or Mg, wherein the doping concentration of Zn, C, or Mg is between $1*10^{19}$ cm$^{-3}$ and $1*10^{21}$ cm$^{-3}$. The thickness of the contact layer 404 is between 0.1 μm and 2 μm. The well layers of active stack 403 comprise $(Al_xGa_{1-x})_yIn_{1-y}As$, 0.1<x<0.5, 0.3<y<0.6, and the barrier layers comprise $(Al_xGa_{1-x})_yIn_{1-y}As$, 0.4<x<0.8, 0.3<y<0.6. The thickness of each of the well layers is between 5 nm and 100 nm, and the thickness of each of the barrier layers is between 10 nm and 100 nm. The bandgap of the barrier layer is larger than that of the well layer. In the embodiment, the active stack 403 emits a light with a peak wavelength between 1000 nm and 1500 nm.

The first electrode 50 can be made of metal comprising Ge, Au, Ni, Be, AuBe, GeAuNi or the combination thereof. The second electrode 51 is on a side of the growth substrate 10 opposite to the reaction layer 20. The second electrode 51 comprises Au, Ti, Pt or combination thereof. The first electrode 50 and the second electrode 51 conduct outside electric current to flow through the active stack 403 so the semiconductor light-emitting unit 100 is capable to emit light.

In accordance with the first embodiment, the specific examples 1~8 are as following, which form a portion of the first embodiment.

EXAMPLE 1

In the example, the average roughness (Ra) of the rough surface 20b is between 50 nm and 100 nm. The thickness of the reaction layer 20 is about 0.5 μm. The material of the reaction layer 20 is $(Al_yGa_{1-y})_{1-x}In_xP$, 0.4≤x≤0.6, 0<y≤0.6. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is InP. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å, and the difference of the lattice constant between the buffer layer 30 and the growth substrate 10 is at least larger than 0.1 Å.

The material of the first semiconductor stack 401 is InP. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 μm. The material of the second semiconductor stack 402 is InP. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 μm. The contact layer 404 comprises $In_xGa_{1-x}As$, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 μm and 2 μm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

EXAMPLE 2

In the example, the average roughness (Ra) of the rough surface 20b is between 50 nm and 100 nm. The thickness of the reaction layer 20 is about 2 μm. The material of the reaction layer 20 is $In_xGa_{1-x}P$, 0<x<1. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is InP. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å, and the difference of the lattice constant between the buffer layer 30 and the growth substrate 10 is at least larger than 0.1 Å.

The material of the first semiconductor stack 401 is InP. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 μm. The material of the second semiconductor stack 402 is InP. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 μm. The contact layer 404 comprises $In_xGa_{1-x}As$, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 μm and 2 μm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

EXAMPLE 3

In the example, the average roughness (Ra) of the rough surface 20b is between 50 nm and 100 nm. The thickness of the reaction layer 20 is about 0.5 μm. The material of the reaction layer 20 is $(Al_yGa_{1-y})_{1-x}In_xP$, 0.4≤x≤0.6, 0<y≤0.6. The reaction layer 20 is n-type semiconductor doped with Si, wherein the doping concentration of Si is between $1*10^{17}$ $cm^{-3}$ and $1*10^{19}$ $cm^{-3}$.

The material of the buffer layer 30 is $In_yGa_{1-y}P$, 0<y<1. The buffer layer 30 is doped with Si or Te to form an n-type semiconductor, wherein the doping concentration of Si or Te is between $1*10^{17}$ $cm^{-3}$ and $1*10^{19}$ $cm^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is InP. The first semiconductor stack 401 is doped with Si to form n-type semiconductor, wherein the doping concentration of Si is between $5*10^{16}$ $cm^{-3}$ and $5*10^{18}$ $cm^{-3}$. The thickness of the first semiconductor stack 401 is about 0.5 μm. The material of the second semiconductor stack 402 is InP. The second semiconductor stack 402 is doped with Zn to form p-type semiconductor, wherein the doping concentration of Zn is between $5*10^{16}$ $cm^{-3}$ and $1*10^{19}$ $cm^{-3}$. The thickness of the second semiconductor stack 402 is about 0.5 μm. The contact layer 404 comprises $In_xGa_{1-x}As$, 0<x<1, and is doped with Zn to form a p-type semiconductor, wherein the doping concentration of Zn is between $1*10^{19}$ $cm^{-3}$ and $1*10^{21}$ $cm^{-3}$. The thickness of the contact layer 404 is between 0.1 μm and 2 μm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

EXAMPLE 4

In the example, the average roughness (Ra) of the rough surface 20b is between 50 nm and 100 nm. The thickness of the reaction layer 20 is about 2 μm. The material of the reaction layer 20 is $In_xGa_{1-x}P$, 0<x<1. The reaction layer 20 is n-type semiconductor doped with Si, wherein the doping concentration of Si is between $1*10^{17}$ $cm^{-3}$ and $1*10^{19}$ $cm^{-3}$.

The material of the buffer layer 30 is $In_yGa_{1-y}P$, 0<y<1. The buffer layer 30 is doped with Si or Te to form an n-type semiconductor, wherein the doping concentration of Si or Te is between $1*10^{17}$ $cm^{-3}$ and $1*10^{19}$ $cm^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is InP. The first semiconductor stack 401 is doped with Si to form n-type semiconductor, wherein the doping concentration of Si is between $5*10^{16}$ $cm^{-3}$ and $5*10^{18}$ $cm^{-3}$. The thickness of the first semiconductor stack 401 is about 0.5 μm. The material of the second semiconductor stack 402 is InP. The second semiconductor stack 402 is doped with Zn to form p-type semiconductor, wherein the doping concentration of Zn is between $5*10^{16}$ $cm^{-3}$ and $1*10^{19}$ $cm^{-3}$. The thickness of the second semiconductor stack 402 is about 0.5 μm. The contact layer 404 comprises $In_xGa_{1-x}As$, 0<x<1, and is doped with Zn to form a p-type semiconductor, wherein the doping concentration of Zn is between $1*10^{19}$ $cm^{-3}$ and $1*10^{21}$ $cm^{-3}$. The thickness of the contact layer 404 is between 0.1 μm and 2 μm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

EXAMPLE 5

In the example, the average roughness (Ra) of the rough surface 20b is between 50 nm and 100 nm. The thickness of the reaction layer 20 is about 0.5 μm. The material of the reaction layer 20 is $(Al_yGa_{1-y})_{1-x}In_xP$, 0.4≤x≤0.6, 0<y≤0.6. The reaction layer 20 is n-type semiconductor doped with Si, wherein the doping concentration of Si is between $1*10^{17}$ $cm^{-3}$ and $1*10^{19}$ $cm^{-3}$.

The material of the buffer layer 30 is InP. The buffer layer 30 is doped with Si or Te to form an n-type semiconductor, wherein the doping concentration of Si or Te is between $1*10^{17}$ $cm^{-3}$ and $1*10^{19}$ $cm^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is $In_bAl_{1-b}As$, 0<b<1. The first semiconductor stack 401 is doped with Si to form n-type semiconductor, wherein the doping concentration of Si is between $5*10^{16}$ $cm^{-3}$ and $5*10^{18}$ $cm^{-3}$. The thickness of the first semiconductor stack 401 is about 0.5 μm. The material of the second semiconductor stack 402 is $In_bAl_{1-b}As$, 0<b<1. The second semiconductor stack 402 is doped with Zn to form p-type semiconductor, wherein the doping concentration of Zn is between $5*10^{16}$ $cm^{-3}$ and $1*10^{19}$ $cm^{-3}$. The thickness of the second semiconductor stack 402 is about 0.5 μm. The contact layer 404 comprises $In_xGa_{1-x}As$, 0<x<1, and is doped with Zn to form a p-type semiconductor, wherein the doping concentration of Zn is between $1*10^{19}$ $cm^{-3}$ and $1*10^{21}$ $cm^{-3}$. The thickness of the contact layer 404 is between 0.1 μm and 2 μm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

EXAMPLE 6

In the example, the average roughness (Ra) of the rough surface 20b is between 50 nm and 100 nm. The thickness of the reaction layer 20 is about 2 μm. The material of the reaction layer 20 is $In_xGa_{1-x}P$, 0<x<1. The reaction layer 20 is n-type semiconductor doped with Si, wherein the doping concentration of Si is between $1*10^{17}$ $cm^{-3}$ and $1*10^{19}$ $cm^{-3}$.

The material of the buffer layer 30 is InP. The buffer layer 30 is doped with Si or Te to form an n-type semiconductor, wherein the doping concentration of Si or Te is between $1*10^{17}$ $cm^{-3}$ and $1*10^{19}$ $cm^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is $In_bAl_{1-b}As$, 0<b<1. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 µm. The material of the second semiconductor stack 402 is $In_bAl_{1-b}As$, 0<b<1. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 µm. The contact layer 404 comprises $In_xGa_{1-x}As$, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 µm and 2 µm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

EXAMPLE 7

In the example, the average roughness (Ra) of the rough surface 20b is between 50 nm and 100 nm. The thickness of the reaction layer 20 is about 0.5 µm. The material of the reaction layer 20 is $(Al_yGa_{1-y})_{1-x}In_xP$, 0.4≤x≤0.6, 0<y≤0.6. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is $In_xGa_{1-x}P$, 0<x<1. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is $In_bAl_{1-b}As$, 0<b<1. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 µm. The material of the second semiconductor stack 402 is $In_bAl_{1-b}As$, 0<b<1. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 µm. The contact layer 404 comprises $In_xGa_{1-x}As$, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 µm and 2 µm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

EXAMPLE 8

In the example, the average roughness (Ra) of the rough surface 20b is between 50 nm and 100 nm. The thickness of the reaction layer 20 is about 2 µm. The material of the reaction layer 20 is $In_xGa_{1-x}P$, 0<x<1. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is $In_yGa_{1-y}P$, 0<y<1. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is $In_bAl_{1-b}As$, 0<b<1. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 µm. The material of the second semiconductor stack 402 is $In_bAl_{1-b}As$, 0<b<1. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 µm. The contact layer 404 comprises $In_xGa_{1-x}As$, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 µm and 2 µm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

Second Embodiment

FIGS. 2A~2D show a process flow of a method for forming a semiconductor light-emitting unit 200 in accordance with the second embodiment.

Figure 2A:
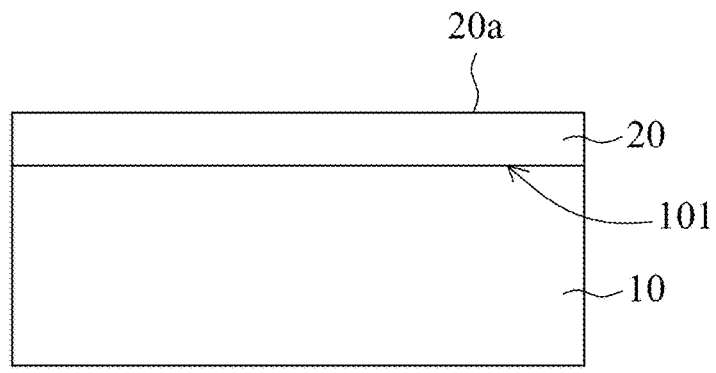
FIGS. 2A~2D show a process flow diagram of a method for forming the semiconductor light-emitting unit in accordance with the second embodiment.

As shown in FIG. 2A, the method of forming the semiconductor light-emitting unit 200 comprises providing a growth substrate 10 and epitaxially growing a reaction layer 20 on the growth substrate 10 in an epitaxial growth equipment, wherein the epitaxial growth method comprises MOCVD (Metal-organic chemical vapor deposition), HVPE (Hydride vapor phase epitaxial) or LPE (Liquid-phase epitaxy). The reaction layer 20 and the growth substrate 10 are lattice-matched. A thickness of the growth substrate 10 is at least larger than 100 µm for supporting the structure or the stack formed later on thereof. The material of the growth substrate 10 comprises p-type or n-type III-V semiconductor compound, which is preferably a single crystal structure, wherein the III-V semiconductor compound comprises IIIA arsenide compound, such as n-type GaAs doped with n-type impurity comprising Si or Te. In the embodiment, the growth substrate 10 comprises IIIA arsenide, such as GaAs, and has a growth surface 101 for epitaxial growth, wherein the growth surface 101 and a crystal surface of (100) have an angle θ between thereof, 0 degree≤θ≤15 degrees. In the embodiment, the reaction layer 20 is epitaxially grown on the growth surface 101 of the growth substrate 10 and covers the entire growth surface 101. The reaction layer 20 has an upper surface 20a used for growing other epitaxial layer(s). The material of the reaction layer 20 comprises p-type or n-type III-V semiconductor material which comprises the elements different from the IIIA element or VA element of the growth substrate 10. In the embodiment, the reaction layer 20 comprises III-V quaternary semiconductor compound, such as $(Al_yGa_{1-y})_{1-x}In_xP$, 0<x<1, 0<y<1; to be more specific, the material of the reaction layer 20 comprises $(Al_yGa_{1-y})_{1-x}In_xP$, $0.4 \leq x \leq 0.6$, $0 < y \leq 0.6$, wherein the reaction layer 20 is n-type semiconductor doped with Si, wherein the doping concentration of Si is between $1*10^{17}$ cm$^{-3}$ and $1*10^{19}$ cm$^{-3}$. In the embodiment, because the reaction layer 20 comprises Al, a protective layer (not shown) is formed to cover all of the upper surface 20a of the reaction layer 20 to prevent Al from being exposed in the air and oxidized in the following processes. The protective layer comprises the III-V semiconductor compound without Al, such as GaAs. Alternatively, the material of the reaction layer 20 comprises a ternary III-V semiconductor compound, such as $In_xGa_{1-x}P$, $0 < x < 1$. Because the reaction layer 20 does not have Al, a protective layer is not necessary formed to cover the upper surface 20a of the reaction layer 20. The thickness of the reaction layer 20 is between 0.1 μm and 10 μm.

Figure 2B:
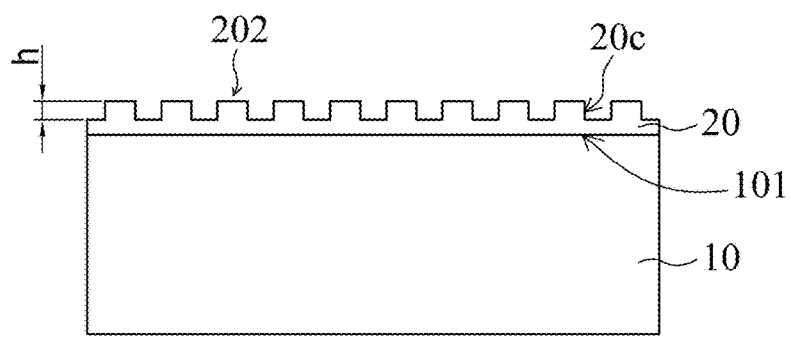
Figure 3:
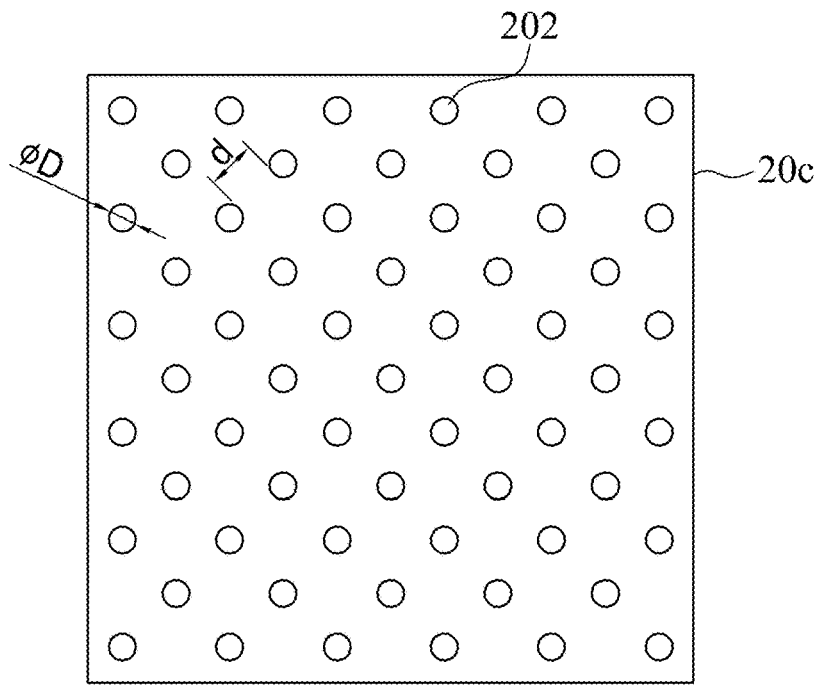
FIG. 3 shows the top-view of the reaction layer disclosed in the second embodiment.

Next, as shown in FIG. 2B, after the structure shown in FIG. 2A is formed and moved out from the epitaxial growth equipment, the upper surface 20a of the reaction layer 20 is patterned to form a regular pattern surface 20c. In the embodiment, as shown in FIG. 3, the regular pattern surface 20c comprises multiple cylinders 202 which form a two dimensional array. A distance d between any two of the neighboring cylinders 202 is between 1 μm and 100 μm, and preferably between 5 μm and 25 μm. Each of the cylinders 202 has a diameter D between 1 μm and 100 μm. As shown in FIG. 2B, the height h of each of the cylinders 202 is between 1 nm and 1000 nm, and preferable between 50 nm and 200 nm. In the embodiment, as the upper surface 20a is covered by the protective layer, the protective layer is totally removed to form the regular pattern surface 20c during the roughening process. The roughening process comprises wet etch process or dry etch process, wherein the etchant used in the wet etch process comprises phosphoric acid, ammonia or the combination thereof, and the dry etch process comprises plasma etching, such as RIE (Reactive Ion Etching) comprising ICP (Inductively Coupled Plasma).

Figure 2C:
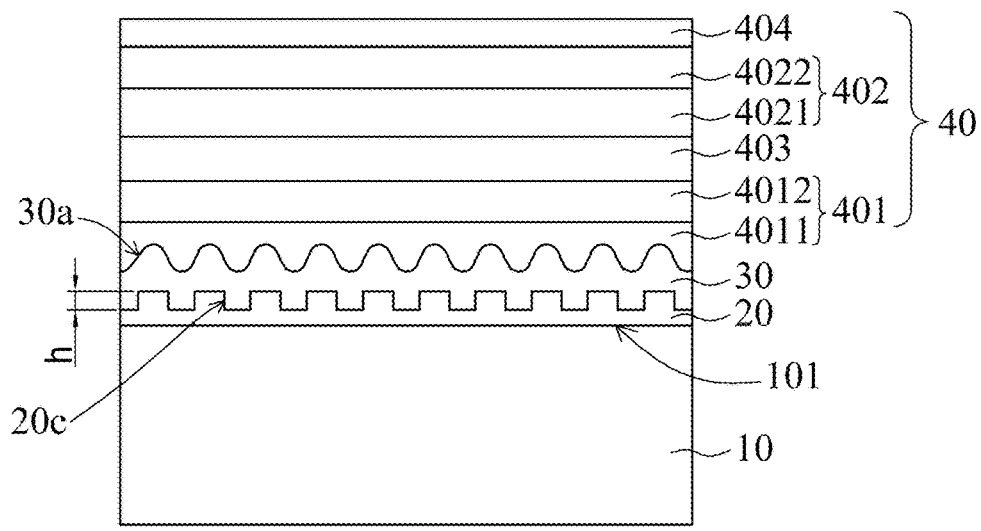

Then, as shown in FIG. 2C, the structure shown in FIG. 2B is put into the epitaxial growth equipment, and a buffer layer 30 is formed to cover all of the regular pattern surface 20c by epitaxial growth method, wherein the epitaxial growth method comprises MOCVD (Metal-organic chemical vapor deposition), HVPE (Hydride vapor phase epitaxial) or LPE (Liquid-phase epitaxy). The buffer layer 30 and the reaction layer 20 are lattice-mismatched, and the buffer layer 30 and the growth substrate 10 are lattice-mismatched as well. In the embodiment, the material of the buffer layer 30 comprises IIIA phosphide semiconductor and the bandgap thereof is smaller than 1.4 eV, such as $In_yGa_{1-y}P$, $0 < y < 1$. In the embodiment, the buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å. The process of forming the buffer layer 30 comprises multiple annealing procedures, wherein the annealing procedure is performed in the epitaxial growth equipment by raising the temperature to a high temperature region and sustaining for minutes, lowering the temperature in the epitaxial growth equipment to a low temperature region and sustaining for minutes, and then immediately raising the temperature to the high temperature region and sustaining for minutes. The high temperature region is between 750° C. and 900° C., and the low temperature region is between 400° C. and 550° C. The annealing procedure is repeated for several cycles to release the stress due to the lattice mismatch between the buffer layer 30 and the reaction layer 20 and decrease the density of the dislocations in the buffer layer 30.

Next, a light-emitting stack 40 is formed on the buffer layer 30 by epitaxial growth method. The light-emitting stack 40 comprises a first semiconductor layer 401, an active stack 403, a second semiconductor stack 402 and a contact layer 404 sequentially epitaxially grown on a surface 30a of the buffer layer 30, wherein the epitaxial growth method comprises MOCVD (Metal-organic chemical vapor deposition), HVPE (Hydride vapor phase epitaxial) or LPE (Liquid-phase epitaxy). In the embodiment, the active stack 403 comprises MQW (Multi-Quantum Wells) structure which has multiple well layers and multiple barrier layers (not shown) alternately stacked. The first semiconductor stack 401 comprises an n-type cladding layer 4011 and an n-type confining layer 4012, and the second semiconductor stack 402 comprises a p-type cladding layer 4022 and a p-type confining layer 4021. The n-type cladding layer 4011 and the p-type cladding layer 4022 respectively provide electrons and holes. The n-type confining layer 4012 and the p-type confining layer 4021 can increase the percentage of the combination of the electrons and the holes in the active stack 403. The n-type confining layer 4012 and the p-type confining layer 4021 have bandgaps larger than or equal to the bandgap of the barrier layer of the active stack 403, or are thicker than the barrier layer of the active stack 403. The contact layer 404 comprises semiconductor material, of which the electrical polarity is the same as that of the second semiconductor layer 402, such as p-type. The concentration of the doping material of the contact layer 404 is between $10^{19}$ cm$^{-3}$ and $10^{21}$ cm$^{-3}$ which is higher than that of the second semiconductor stack 402, so that the contact layer 404 is able to ohmically contact an first electrode 50 which is formed subsequently, wherein the resistance between the contact layer 404 and the first electrode 50 is lower than $10^{-3}$ Ω/cm$^2$. In another embodiment, with transfer process, the growth substrate 10 can be replaced by a bonding substrate with higher electrical conductivity, higher heat conductivity, or larger transparency than the growth substrate 10 for different use. During the transfer process, the growth substrate 10 is removed and the bonding substrate is bonded to one side of the reaction layer 20 or the buffer layer 30 with a bonding structure to form a semiconductor light-emitting unit with the bonding structure.

Figure 2D:
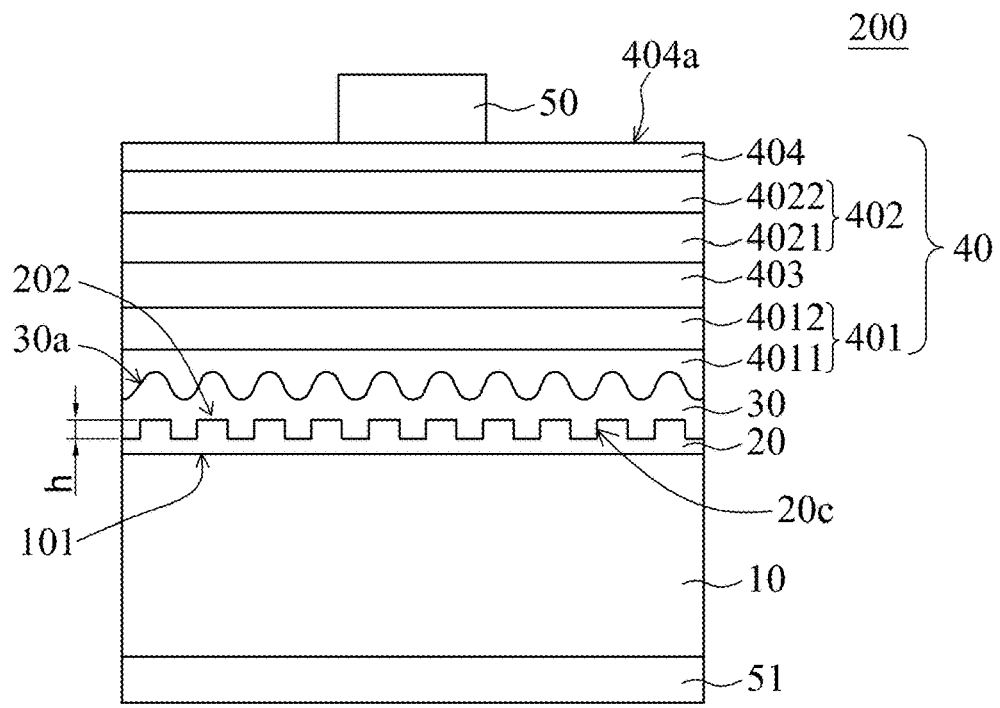

Next, as shown in FIG. 2D, the first electrode 50 is formed on an upper surface 404a of the contact layer 404, and a second electrode 51 is formed on the other side of the growth substrate 10 opposite to the reaction layer 20 to form a semiconductor light-emitting unit 200 in accordance with the second embodiment.

As shown in FIG. 2D, the semiconductor light-emitting unit 200 comprises a growth substrate 10, a reaction layer 20 having a regular pattern surface 20c, wherein the regular pattern surface 20c is on a side opposite to the growth substrate 10, a buffer layer 30 on and covering all of the regular pattern surface 20c, a light-emitting stack 40 on a surface 30a of the buffer layer 30, a first electrode 50 on an upper surface 404a of the contact layer 404, and a second electrode 51 on the other side of the growth substrate 10 opposite to the reaction layer 20.

A thickness of the growth substrate 10 is at least larger than 100 μm for supporting the structure or the stack formed later on thereof. The material of the growth substrate 10 comprises p-type or n-type III-V semiconductor compound, which is preferably a single crystal structure, wherein the III-V semiconductor compound comprises GaAs, such as n-type GaAs doped with n-type impurity comprising Si or Te.

In the embodiment, the buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å. As shown in FIG. 4, in the embodiment, the buffer layer 30 has a dislocation density smaller than $1*10^9$ cm$^{-2}$, and preferably between $1*10^7$ cm$^{-2}$ and $1*10^9$ cm$^{-2}$, wherein the method for calculating the dislocation density is the same as the method described in the first structure embodiment. In the embodiment, the quality of the buffer layer 30 is checked by XRD (X-ray diffraction) chart, and the XRD chart of the buffer layer 30 has a FWHM (Full width at half maximum) smaller than 500 arcsec.

The peak wavelength of the light emitted from the light-emitting stack 40 is determined by the material of the well layers of the active stack 403. In the embodiment, the difference of the crystal constant between the first semiconductor stack 401 and the buffer layer 30 is smaller than 0.1 Å and the difference of the lattice constant between the first semiconductor stack 401 and the reaction layer 20 is at least larger than 0.1 Å. The first semiconductor stack 401 comprises InP or In$_b$Al$_{1-b}$As, 0<b<1, and is doped with Si or Te, wherein the doping concentration of Si or Te is between $5*10^{16}$ cm$^{-3}$ and $5*10^{18}$ cm$^{-3}$. The thickness of the first semiconductor stack 401 is between 0.1 μm and 10 μm, and preferably between 0.1 μm and 2 μm. The difference of the lattice constant between the second semiconductor stack 402 and the buffer layer 30 is smaller than 0.1 Å, the difference of the lattice constant between the second semiconductor stack 402 and the reaction layer 20 is at least larger than 0.1 Å, and the difference of the lattice constant between the second semiconductor stack 402 and the growth substrate 10 is at least larger than 0.1 Å. The second semiconductor stack 402 comprises InP or In$_b$Al$_{1-b}$As, 0<b<1, and is doped with Zn, C, or Mg, wherein the doping concentration of Zn, C, or Mg is between $5*10^{16}$ cm$^{-3}$ and $5*10^{19}$ cm$^{-3}$. The thickness of the second semiconductor stack 402 is between 0.1 μm and 10 μm, and preferably between 0.1 μm and 2 μm. The contact layer 404 comprises In$_x$Ga$_{1-x}$As, 0<x<1, and is doped with Zn, C, or Mg, wherein the doping concentration of Zn, C, or Mg is between $1*10^{19}$ cm$^{-3}$ and $1*10^{21}$ cm$^{-3}$. The thickness of the contact layer 404 is between 0.1 μm and 2 μm. The well layers of active stack 403 comprise (Al$_x$Ga$_{1-x}$)$_y$In$_{1-y}$As, 0.1<x<0.5, 0.3<y<0.6, and the barrier layers comprise (Al$_x$Ga$_{1-x}$)$_y$In$_{1-y}$As, 0.4<x<0.8, 0.3<y<0.6. The thickness of each of the well layers is between 5 nm and 100 nm and the thickness of each of the barrier layers is between 10 nm and 100 nm. The bandgap of the barrier layer is larger than that of the well layer. In the embodiment, the active stack 403 emits a light with a peak wavelength 1000 nm and 1500 nm.

The first electrode 50 is made of metal comprising Ge, Au, Ni, Be, AuBe, GeAuNi or the combination thereof. The second electrode 51 is on a side of the growth substrate 10 opposite to the reaction layer 20. The second electrode 51 comprises Au, Ti, Pt or combination thereof. The first electrode 50 and the second electrode 51 can conduct outside electric current to flow through the active stack 403 for emitting light with a specific peak wavelength, so the semiconductor light-emitting unit 100 is capable to emit light.

In accordance with the second embodiment, the specific examples 9~16 are as following, which form a portion of the second embodiment.

EXAMPLE 9

In the example, the distance d between any two of the neighboring cylinders 202 is 8.36 μm. The diameter D of each of the cylinders 202 is 13.12 μm. The thickness of the reaction layer 20 is about 0.5 μm. The material of the reaction layer 20 is (Al$_y$Ga$_{1-y}$)$_{1-x}$In$_x$P, 0.4≤x≤0.6, 0<y≤0.6. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is InP. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is InP. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 μm. The material of the second semiconductor stack 402 is InP. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 μm. The material of the contact layer 404 comprises In$_x$Ga$_{1-x}$As, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 μm and 2 μm. The active stack 403 has 10 pairs of well layer and barrier layer, wherein the material of the well layer is (Al$_{0.3}$Ga$_{0.7}$)$_{0.47}$In$_{0.53}$As and the material of the barrier layer is (Al$_{0.58}$Ga$_{0.42}$)$_{0.47}$In$_{0.53}$As. The thickness of each of the well layers is between 5 nm and 100 nm and the thickness of each of the barrier layers is between 10 nm and 100 nm.

EXAMPLE 10

In the example, the distance d between any two of the neighboring cylinders 202 is 8.36 μm. The diameter D of each of the cylinders 202 is 13.12 μm. The material of the reaction layer 20 is In$_x$Ga$_{1-x}$P, 0<x<1. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is InP. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is InP. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 μm. The material of the second semiconductor stack 402 is InP. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 µm. The material of the contact layer 404 comprises In$_x$Ga$_{1-x}$As, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 µm and 2 µm. The active stack 403 has 10 pairs of well layer and barrier layer, wherein the material of the well layer is (Al$_{0.3}$Ga$_{0.7}$)$_{0.47}$In$_{0.53}$As and the material of the barrier layer is (Al$_{0.58}$Ga$_{0.42}$)$_{0.47}$In$_{0.53}$As. The thickness of each of the well layers is between 5 nm and 100 nm and the thickness of each of the barrier layers is between 10 nm and 100 nm.

EXAMPLE 11

In the example, the distance d between any two of the neighboring cylinders 202 is 8.36 µm. The diameter D of each of the cylinders 202 is 13.12 µm. The material of the reaction layer 20 is (Al$_y$Ga$_{1-y}$)$_{1-x}$In$_x$P, 0.4≤x≤0.6, 0<y≤0.6. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is In$_y$Ga$_{1-y}$P, 0<y<1. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is InP. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 µm. The material of the second semiconductor stack 402 is InP. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 µm. The material of the contact layer 404 comprises In$_x$Ga$_{1-x}$As, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 µm and 2 µm. The active stack 403 has 10 pairs of well layer and barrier layer, wherein the material of the well layer is (Al$_{0.3}$Ga$_{0.7}$)$_{0.47}$In$_{0.53}$As and the material of the barrier layer is (Al$_{0.58}$Ga$_{0.42}$)$_{0.47}$In$_{0.53}$As. The thickness of each of the well layers is between 5 nm and 100 nm and the thickness of each of the barrier layers is between 10 nm and 100 nm.

EXAMPLE 12

In the embodiment, the distance d between any two of the neighboring cylinders 202 is 8.36 µm. The diameter D of each of the cylinders 202 is 13.12 µm. The thickness of the reaction layer 20 is about 2 µm. The material of the reaction layer 20 is In$_x$Ga$_{1-x}$P, 0<x<1. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is In$_y$Ga$_{1-y}$P, 0<y<1. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is InP. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 µm. The material of the second semiconductor stack 402 is InP. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 µm. The material of the contact layer 404 comprises In$_x$Ga$_{1-x}$As, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 µm and 2 µm. The active stack 403 has 10 pairs of well layer and barrier layer, wherein the material of the well layer is (Al$_{0.3}$Ga$_{0.7}$)$_{0.47}$In$_{0.53}$As and the material of the barrier layer is (Al$_{0.58}$Ga$_{0.42}$)$_{0.47}$In$_{0.53}$As. The thickness of each of the well layers is between 5 nm and 100 nm and the thickness of each of the barrier layers is between 10 nm and 100 nm.

EXAMPLE 13

In the example, the distance d between any two of the neighboring cylinders 202 is 8.36 µm. The diameter D of each of the cylinders 202 is 13.12 µm. The thickness of the reaction layer 20 is about 2 µm. The material of the reaction layer 20 is (Al$_y$Ga$_{1-y}$)$_{1-x}$In$_x$P, 0.4≤x≤0.6, 0<y≤0.6. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is InP. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is In$_b$Al$_{1-b}$As, 0<b<1. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 µm. The material of the second semiconductor stack 402 is In$_b$Al$_{1-b}$As, 0<b<1. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 µm. The material of the contact layer 404 comprises In$_x$Ga$_{1-x}$As, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 µm and 2 µm. The active stack 403 has 10 pairs of well layer and barrier layer, wherein the material of the well layer is (Al$_{0.3}$Ga$_{0.7}$)$_{0.47}$In$_{0.53}$As, and the material of the barrier layer is (Al$_{0.58}$Ga$_{0.42}$)$_{0.47}$In$_{0.53}$As.

The thickness of each of the well layers is between 5 nm and 100 nm and the thickness of each of the barrier layers is between 10 nm and 100 nm.

EXAMPLE 14

The distance d between any two of the neighboring cylinders 202 is 8.36 μm. The diameter D of each of the cylinders 202 is 13.12 μm. The thickness of the reaction layer 20 is about 2 μm. The material of the reaction layer 20 is $In_xGa_{1-x}P$, 0<x<1. The reaction layer 20 is n-type semiconductor doped with Si, wherein the doping concentration of Si is between $1*10^{17}$ cm$^{-3}$ and $1*10^{19}$ cm$^{-3}$.

The buffer layer 30 is formed to cover the entire regular pattern surface 20c. The material of the buffer layer 30 is InP. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is $In_bAl_{1-b}As$, 0<b<1. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 μm. The material of the second semiconductor stack 402 is $In_bAl_{1-b}As$, 0<b<1. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 μm. The material of the contact layer 404 comprises $In_xGa_{1-x}As$, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 μm and 2 μm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm, and the thickness of each of the barrier layers is between 10 nm and 100 nm.

EXAMPLE 15

In the example, the distance d between any two of the neighboring cylinders 202 is 8.36 μm. The diameter D of each of the cylinders 202 is 13.12 μm. The thickness of the reaction layer 20 is about 0.5 μm. The material of the reaction layer 20 is $(Al_yGa_{1-y})_{1-x}In_xP$, 0.4≤x≤0.6, 0<y≤0.6. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is $In_xGa_{1-x}P$, 0<x<1. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is $In_bAl_{1-b}As$, 0<b<1. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 μm. The material of the second semiconductor stack 402 is $In_bAl_{1-b}As$, 0<b<1. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 μm. The material of the contact layer 404 comprises $In_xGa_{1-x}As$, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 μm and 2 μm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

EXAMPLE 16

In the embodiment, the distance d between any two of the neighboring cylinders 202 is 8.36 μm. The diameter D of each of the cylinders 202 is 13.12 μm. The thickness of the reaction layer 20 is about 2 μm. The material of the reaction layer 20 is $In_xGa_{1-x}P$, 0<x<1. The reaction layer 20 is n-type semiconductor doped with Si, wherein the doping concentration of Si is between $1*10^{17}$ cm$^{-3}$ and $1*10^{19}$ cm$^{-3}$.

The material of the buffer layer 30 is $In_yGa_{1-y}P$, 0<y<1. The buffer layer 30 is doped with Si or Te to form an n-type semiconductor, wherein the doping concentration of Si or Te is between $1*10^{17}$ cm$^{-3}$ and $1*10^{19}$ cm$^{-3}$. The difference of the lattice constant between the buffer layer 30 and the reaction layer 20 is at least larger than 0.1 Å and the difference of the lattice constant between the buffer layer 30 and the growth substrate 10 is at least larger than 0.1 Å.

The material of the first semiconductor stack 401 is $In_bAl_{1-b}As$, 0<b<1. The first semiconductor stack 401 is doped with Si to form n-type semiconductor, wherein the doping concentration of Si is between $5*10^{16}$ cm$^{-3}$ and $5*10^{18}$ cm$^{-3}$. The thickness of the first semiconductor stack 401 is about 0.5 μm. The material of the second semiconductor stack 402 is $In_bAl_{1-b}As$, 0<b<1. The second semiconductor stack 402 is doped with Zn to form p-type semiconductor, wherein the doping concentration of Zn is between $5*10^{16}$ cm$^{-3}$ and $1*10^{19}$ cm$^{-3}$. The thickness of the second semiconductor stack 402 is about 0.5 μm. The material of the contact layer 404 comprises $In_xGa_{1-x}As$, 0<x<1, and is doped with Zn to form a p-type semiconductor, wherein the doping concentration of Zn is between $1*10^{19}$ cm$^{-3}$ and $1*10^{21}$ cm$^{-3}$. The thickness of the contact layer 404 is between 0.1 μm and 2 μm. The active stack 403 has 10 pairs of well layer and barrier layer, wherein the material of the well layer is $(Al_{0.3}Ga_{0.7})_{0.47}In_{0.53}As$ and the material of the barrier layer is $(Al_{0.58}Ga_{0.42})_{0.47}In_{0.53}As$. The thickness of each of the well layers is between 5 nm and 100 nm and the thickness of each of the barrier layers is between 10 nm and 100 nm.

Although the present application has been explained above, it is not the limitation of the range, the sequence in practice, the material in practice, or the method in practice. Any modification or decoration for present application is not detached from the spirit and the range of such.

What is claimed is:
1. A method forming a semiconductor light-emitting unit, comprising the steps of:
   providing a semiconductor substrate;
   epitaxially growing a reaction layer on the semiconductor substrate; and
   epitaxially growing a buffer layer on the reaction layer, wherein the buffer layer and the semiconductor substrate are lattice-mismatched, and a dislocation density of the buffer layer is smaller than $1*10^9$ cm$^{-2}$, and wherein the buffer layer comprises GaP or InP.

2. The method according to claim 1, further comprising a step of forming a pattern surface by patterning a surface of the reaction layer, and epitaxially growing a light-emitting stack on the buffer layer.

3. The method according to claim 1, wherein a difference of lattice constant between the buffer layer and the semiconductor substrate is larger than 0.1Å.

4. The method according to claim 1, wherein an X-ray diffraction (XRD) chart of the buffer layer comprises a Full Width at Half Maximum (FWHM) smaller than 500 arcsec.

5. The method according to claim 1, wherein a bandgap of the buffer layer is smaller than 1.4eV.

6. The method according to claim 1, wherein the semiconductor substrate comprises IIIA arsenide.

7. The method according to claim 6, wherein semiconductor substrate comprises GaAs.

8. The method according to claim 2, wherein the patterned surface comprises a regular pattern.

9. The method according to claim 8, wherein the regular pattern comprises multiple cylinders and a distance between any two of the neighboring cylinders is the same.

10. The method according to claim 2, wherein the patterned surface comprises an irregular pattern.

11. The method according to claim 1, wherein the reaction layer comprises III-V semiconductor compound.

12. The method according to claim 11, wherein the reaction layer comprises ternary III-V semiconductor compound or quaternary III-V semiconductor compound.

13. The method according to claim 1, wherein a thickness of the reaction layer is between 0.1 μm and 10 μm.

14. The method according to claim 2, wherein the light-emitting stack emits a light with a peak wavelength between 1000 nm and 1500 nm.

15. The method according to claim 2, wherein the light-emitting stack comprises a first semiconductor layer, an active layer on the first semiconductor layer, a second semiconductor layer on the active layer, and wherein the active layer comprises $(Al_xGa_{1-x})_yIn_{1-y}As$, $0<x<1$, $0<y<1$.

16. The method according to claim 15, wherein both of the active layer and the semiconductor substrate comprise Ga or As.

17. The method according to claim 15, wherein the first semiconductor layer and the second semiconductor layer comprises InP or $In_bAl_{1-b}As$, $0<b<1$.

18. The method according to claim 2, further comprising a step of forming a protective layer on the reaction layer, wherein the reaction layer comprises Al.

19. The method according to claim 18, further comprising a step of removing the protective layer, wherein the protective layer is devoid of Al.

* * * * *